US009042100B2

(12) United States Patent
Kang

(10) Patent No.: US 9,042,100 B2
(45) Date of Patent: May 26, 2015

(54) SYSTEM AND METHOD FOR COOLING HEAT GENERATING COMPONENTS

(71) Applicant: Aavid Thermalloy, LLC, Laconia, NH (US)

(72) Inventor: Sukhvinder S. Kang, Concord, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 315 days.

(21) Appl. No.: 13/826,450

(22) Filed: Mar. 14, 2013

(65) Prior Publication Data

US 2014/0268571 A1  Sep. 18, 2014

(51) Int. Cl.
*H05K 7/20* (2006.01)
*G06F 1/20* (2006.01)

(52) U.S. Cl.
CPC ... *H05K 7/20* (2013.01); *G06F 1/20* (2013.01)

(58) Field of Classification Search
USPC ........................ 361/676–678, 679.46–679.54, 361/688–722, 752, 760, 831
See application file for complete search history.

(56) References Cited

U.S. PATENT DOCUMENTS

| 5,631,821 | A * | 5/1997 | Muso .............................. 363/141 |
| 6,124,632 | A * | 9/2000 | Lo et al. ......................... 257/678 |
| 6,213,195 | B1 * | 4/2001 | Downing et al. ............. 165/80.4 |
| 6,434,003 | B1 * | 8/2002 | Roy et al. ....................... 361/699 |
| 7,173,823 | B1 * | 2/2007 | Rinehart et al. .............. 361/699 |
| 7,265,978 | B2 * | 9/2007 | Suzuki et al. ................. 361/699 |
| 7,876,561 | B2 * | 1/2011 | Schnetzka et al. ............ 361/699 |
| 2005/0211418 | A1 * | 9/2005 | Kenny et al. .................. 165/80.4 |
| 2006/0002087 | A1 * | 1/2006 | Bezama et al. ............... 361/699 |
| 2006/0096738 | A1 * | 5/2006 | Kang et al. .................... 165/80.4 |
| 2009/0146293 | A1 * | 6/2009 | Olesen .......................... 257/714 |
| 2012/0087088 | A1 | 4/2012 | Killion et al. |
| 2012/0152498 | A1 * | 6/2012 | Lyon ........................ 165/104.31 |

FOREIGN PATENT DOCUMENTS

EP   1923770 A1   5/2008

OTHER PUBLICATIONS

Kang, S.S., "Advanced Cooling for Power Electronics," International Conference on Integrated Power Electronics Systems, CIPS, Mar. 6-8, 2012, Nuremberg, Germany, 8 pages.
Kang, S.S., "Advanced Cooling for Power Electronics," Presented at International Conference on Integrated Power Electronics Systems, CIPS, Mar. 6-8, 2012, Nuremberg, Germany, 38 pages.
International Search Report and Written Opinion for corresponding PCT Application No. PCT/US2014/021476.

* cited by examiner

*Primary Examiner* — Courtney Smith
(74) *Attorney, Agent, or Firm* — Wolf, Greenfield & Sacks, P.C.

(57) ABSTRACT

An assembly for cooling heat generating components, such as power electronics, computer processors and other devices. Multiple components may be mounted to a support and cooled by a flow of cooling fluid. A single cooling fluid inlet and outlet may be provided for the support, yet multiple components, including components that have different heat removal requirements may be suitably cooled. One or more manifold elements may provide cooling fluid flow paths that contact a heat transfer surface of a corresponding component to receive heat.

20 Claims, 4 Drawing Sheets

SYSTEM AND METHOD FOR COOLING HEAT GENERATING COMPONENTS

BACKGROUND

Cooling of heat generating components, such as computer processors and other electronic components, is frequently required, particularly for components used in enclosed spaces and/or that have high power demands.

SUMMARY OF INVENTION

Aspects of the invention provide for methods and apparatus for cooling heat generating components, such as power electronics, computer processors, and others. In some arrangements, multiple components may be cooled on a single support by contacting the heat generating components with a flow of cooling fluid, such as a heat exchanger liquid. The cooling fluid may be routed through a manifold element arranged to control flow of the fluid in a way that enhances or otherwise controls the cooling rate of the heat generating components. For example, the manifold element may include one or more cooling areas that each have a plurality of inlet channels that are interdigitated with a plurality of outlet channels. The channels may communicate with a upper surface of the manifold so that the cooling fluid may flow from an inlet channel, across a portion of the upper surface and to an outlet channel. Since the upper surface of the manifold element at the cooling area may be positioned adjacent a heat transfer surface of a heat generating component, the cooling fluid may remove heat from the heat generating component while flowing across the upper surface portion of the manifold element.

In some embodiments, a manifold element may be specifically arranged for cooling a particular heat generating component. For example, the manifold element may have its inlet and outlet channels and/or portions of its upper surface at a cooling area that influence cooling fluid flow arranged to provide a cooling characteristic that matches a heat removal requirement of the heat generating component. In other words, the manifold element may provide a resistance or impedance to the cooling fluid flow that operates with a cooling fluid flow rate to remove heat from the heat generating component to match a heat removal requirement of the heat generating component, e.g., to allow the component to operate properly for an extended period.

In some arrangements, the cooling areas of one or more manifold elements may be arranged in a single cooling fluid flow path, e.g., in series or parallel, such that heat removal requirements for respective heat generating components are met. For example, the manifold elements may be associated with a support plate that has a single cooling fluid inlet, a single cooling fluid outlet, and a flow path between the inlet and outlet. The cooling areas of the manifold element(s) may be arranged in the flow path and configured to meet the heat removal requirements of respective heat generating components. As a result, a simplified assembly for cooling multiple heat generating components may be provided that employs a single inlet and outlet connection and a single cooling liquid flow. In addition, different heat removal requirements of the different heat generating components may be accommodated by tailoring the flow restriction and/or other characteristics of the manifold cooling area used for each heat generating component. For example, even though two different heat generating components may have substantially different heat removal requirements, both may be suitably cooled using a single cooling fluid flow in the support. Moreover, the components may be cooled whether arranged in series or parallel in the cooling fluid flow.

In one aspect of the invention, an assembly for cooling two or more heat generating components includes a support having an inlet for receiving cooling fluid and an outlet for expelling the cooling fluid. As noted above, the support may include a single inlet and a single outlet, allowing the support to be connected to a cooling fluid flow via only two connections. This arrangement may provide a convenient system for cooling multiple heat generating components on a support. In one embodiment, the support may include first and second cavities formed in an upper surface of the support with each cavity in fluid communication with the inlet and the outlet, e.g., so cooling fluid may be provided to the cavities. First and second heat generating components, each having a bottom heat transfer surface, may be arranged to be positioned over the first and second cavities, respectively. Also, the heat generating components may respectively have first and second heat removal requirements, e.g., a rate at which heat is to be removed to allow the component to operate properly. As will be understood by those of skill in the art, such a heat removal requirement will generally define a range of values. First and second manifold elements (or first and second cooling areas of a manifold element) may be arranged in the first and second cavities, respectively, and have a plurality of interdigitated inlet and outlet channels that are open at an upper surface of the manifold element. The first manifold element (or cooling area) may be received in the first cavity with portions of the upper surface in contact with the heat transfer surface of the first heat generating device such that cooling fluid can flow from the inlet channels upwardly into a space between the upper surface of the manifold element and the heat transfer surface of the first component and downwardly into an outlet channel. For example, the upper surface may include protrusions, such as ribs, that contact the heat transfer surface and define flow channels to allow cooling fluid to flow between manifold and the heat transfer surface. Similarly, the second manifold element (or cooling area) may be received in the second cavity with portions of the upper surface in contact with the heat transfer surface of the second heat generating device such that cooling fluid can flow from the inlet channels upwardly into a space between the upper surface of the manifold element and the heat transfer surface of the second component and downwardly into an outlet channel. The inlet and outlet channels and the upper surface of the first and second manifold elements (cooling areas) may be arranged to provide first and second restrictions to flow, respectively, through the manifold element (cooling area) that are matched to the individual heat removal requirements of the respective heat generating components. Also, the first and second flow restrictions of the manifold elements (cooling areas) may be arranged such that the first and second heat removal requirements of the first and second heat generating components are met for a single cooling fluid flow rate provided at the inlet of the support. Thus, the manifold elements (cooling areas) may be arranged in series or in parallel in a cooling fluid flow path of the support, yet be configured to meet the heat transfer requirements for the components, whether those requirements are the same or different from each other.

In some embodiments, the manifold elements may be arranged to operate with a standardized cavity arrangement, but provide different cooling profiles for different heat generating components. For example, the manifold elements may include a sealing feature on the upper surface that circumscribes an area of the upper surface and a cooling area inside the area circumscribed by the sealing feature. In this way, the manifold elements may be sized and configured to interface with a standard cavity arrangement and provide one or more cooling areas sized and arranged to cool a corresponding heat generating device. Also, the manifold elements may be made of a thermally insulating or otherwise low thermal conductivity material, such as plastic. As a result, the manifold elements may be relatively inexpensive and specially tailored to corresponding heat generating components.

In another aspect of the invention, an assembly for cooling two or more heat generating components includes a support having an inlet for receiving cooling fluid, an outlet for expelling the cooling fluid, and a cavity formed in an upper surface that is in fluid communication with the inlet and the outlet. First and second heat generating components each having a bottom heat transfer surface may be positioned over the cavity and respectively have first and second heat removal requirements. A manifold element may be received in the cavity and have first and second cooling areas each including a plurality of interdigitated inlet and outlet channels that are open at an upper surface of the manifold element. The first cooling area may have portions of the upper surface in contact with the heat transfer surface of the first heat generating device such that cooling fluid can flow from the inlet channels upwardly into a space between the upper surface of the manifold element and the heat transfer surface, and downwardly into an outlet channel. Similarly, the second cooling area may have portions of the upper surface in contact with the heat transfer surface of the second heat generating device such that cooling fluid can flow from the inlet channels upwardly into a space between the upper surface of the manifold element and the heat transfer surface, and downwardly into an outlet channel. The inlet and outlet channels and the upper surface of the first and second cooling areas may be arranged to provide first and second restrictions to flow, respectively, through the manifold element that are matched to the individual heat removal requirements of the respective heat generating components.

In one embodiment, the support includes a plate with first and second apertures. The plate may be positioned over the cavity such that the first and second cooling areas of the manifold element extend upwardly through the first and second apertures, respectively, to contact the respective heat generating component. In one arrangement, the first and second heat generating components may be secured to the plate, and a sealing feature may be provided between the plate and the first and second heat generating components, respectively. The sealing feature may circumscribes a corresponding cooling area of the manifold element, thereby helping to seal cooling fluid in the flow path.

In another arrangement, the first and second heat generating components may be secured directly to the manifold element. In this arrangement, a sealing feature may be provided between the manifold element and the first and second heat generating components, respectively, and the sealing feature may circumscribe a corresponding cooling area of the manifold element. Regardless of the specific arrangement, the first and second flow restrictions of the cooling areas may be different from each other, e.g., to match a heat removal requirement of the corresponding heat generating device.

These and other aspects of the invention will be apparent from the following description and claims.

BRIEF DESCRIPTION OF THE DRAWINGS

Aspects of the invention are described with reference to the following drawings in which numerals reference like elements, and wherein.

DETAILED DESCRIPTION

Figure 1:
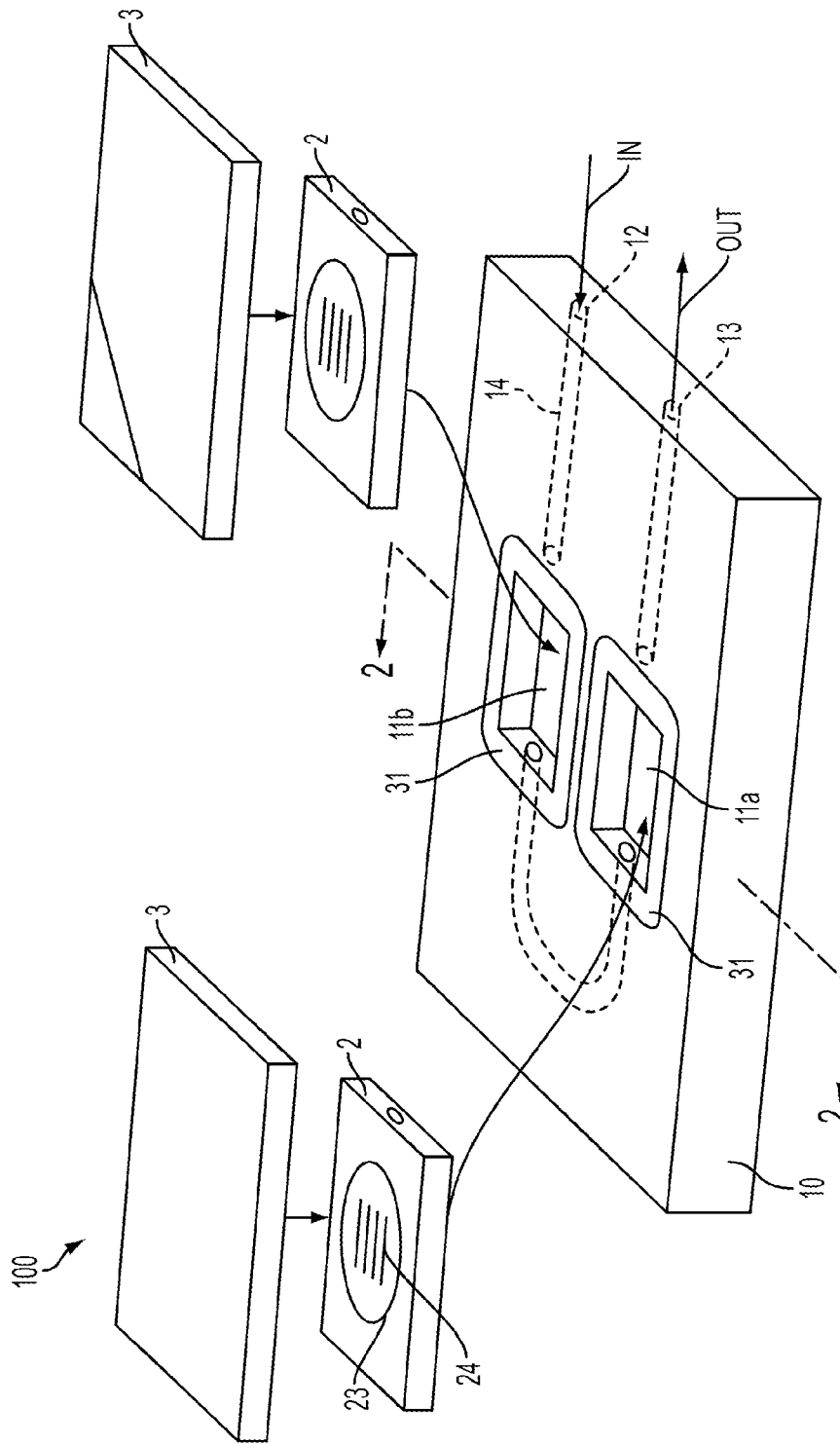
FIG. 1 shows an exploded view of a heat generating component cooling assembly in an illustrative embodiment.

Aspects of the invention are not limited in application to the details of construction and the arrangement of components set forth in the following description or illustrated in the drawings. Other embodiments may be employed and aspects of the invention may be practiced or be carried out in various ways. Also, aspects of the invention may be used alone or in any suitable combination with each other. Thus, the phraseology and terminology used herein is for the purpose of description and should not be regarded as limiting.

FIG. 1 shows an assembly for cooling two or more heat generating components. In this embodiment, a support 10 is arranged to support and cool two or more heat generating components 3, such as power electronics, computer processors, and other devices that generate heat. The support 10 may have any shape, size or other configuration, and may support two or more heat generating components 3. However, in this illustrative embodiment, the support 10 is formed as a plate made of a metal, such as aluminum, and supports two heat generating components 3, though three or more components 3 may be arranged on the support 10. The support 10 may include an inlet 12 for receiving cooling fluid and an outlet 13 for expelling the cooling fluid. While in this embodiment, the support 10 includes a single inlet 12 and a single outlet 13, two or more inlets and/or outlets may be provided. However, in accordance with an aspect of the invention, the support 10 may include a single inlet 12, yet two or more components 3 may be properly cooled, even though those components 3 may have different heat removal requirements. The support 10 may include a flow path 14 that extends from the inlet 12 to the outlet 13 and is arranged so that cooling fluid can be conducted from the inlet 12 to two or more cavities 11 formed in the support 10. Fluid conducted to the cavities 11 may be used to cool the components 3 by the cooling fluid contacting a heat transfer surface of the components 3 so that the fluid can receive heat from the components 3 and be conducted from the support 10. For example, the cooling fluid may be provided to the support inlet 12 from a chiller or other heat exchanging device, used to cool components 3 on the support 10, and then circulated back to the chiller or other heat exchanging device that removes heat from the fluid so that the fluid may be supplied again to the support 10 to cool the components 3. The cooling fluid may be chilled by any suitable arrangement, such as a refrigerant system, heat exchanger, ice bath, etc.

Manifold elements 2 may be provided in the cavities 11 of the support 10 and arranged to distribute a flow of cooling fluid in the flow path 14 so that the cooling fluid contacts the heat transfer surface of the components 3. In this embodiment, the manifold elements 2 each include a cooling area 24 on an upper surface that is located within a space circumscribed by a sealing feature 23, such as an o-ring, on the upper surface. The sealing feature 23 may form a seal with the heat transfer surface of the component 3, helping to define an area that is cooled by the cooling fluid. In addition, the sealing feature 23 may help seal the flow path 14, keeping cooling fluid from leaking from between the manifold element 2 and the component 3. The manifold element 2 may also include seal elements (not shown) to seal a communication port of the cavity 11 to a corresponding port on the manifold element 2 so that fluid may be suitably routed to the cooling area 24. For example, the manifold element 2 may fit tightly into the cavity 11, and the manifold element 2 may have an o-ring or other seal arranged at an inlet and outlet port so that the ports may be sealed in communication with a corresponding port in the cavity 11. Thereafter, the heat generating components 3 may be placed over the manifold elements 2 so that the heat transfer area is in contact with the cooling area 24 of the manifold element 2. The heat generating components 3 may be secured to the support 10 in any suitable way, such as by a clamp that presses the components 3 in contact with the manifold element 2.

Figure 2:
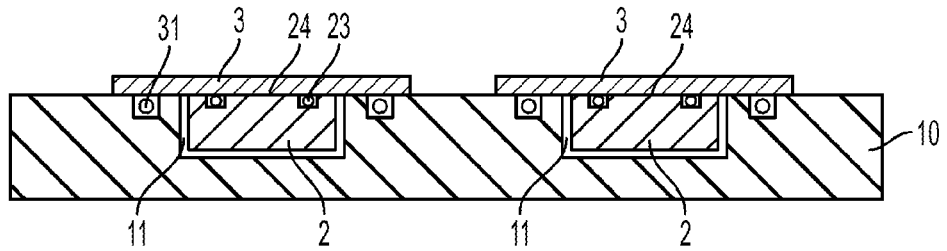
FIG. 2 shows a cross sectional view along the line 2-2 in FIG. 1 in an illustrative embodiment.

FIG. 2 shows a cross sectional view along the line 2-2 in FIG. 1 and shows how the heat transfer surface on the bottom of the heat generating components 3 is in contact with the upper surface of the manifold elements 2, particularly at the cooling area 24. There may also be an additional sealing element 31 between the heat generating components 3 and the support 10 around the cavities 11, e.g., to help prevent leakage of cooling fluid if necessary.

Figure 3:
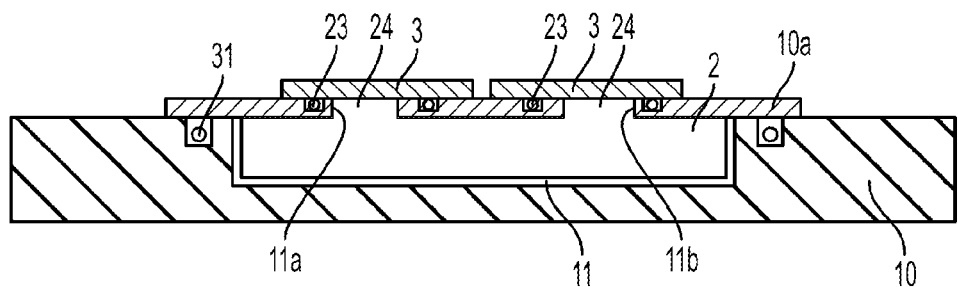
FIG. 3 shows a cross sectional view along the line 2-2 in FIG. 1 in another embodiment.

FIG. 3 shows another illustrative embodiment in which two or more heat generating components 3 are arranged in contact with a single manifold element 2. That is, a manifold element 2 is not limited to operating with one heat generating device, but instead may cool two or more components 3, and those components 3 may be joined directly to the manifold element 2 instead of the support. In this embodiment, the manifold element 2 is secured in the cavity 11 by a plate 10*a* that has cavities 11*a* and 11*b* (e.g., window openings) formed in it and through which cooling area 24 portions of the manifold element 2 extend to contact the respective heat generating component 3. The plate 10*a* may sealingly engage with the support 10 at a sealing element 31, and may sealingly engage with the components 3 at respective sealing features 23. This arrangement with a plate 10*a* may be useful when there is a need to support higher liquid pressure in the cavity 11, and the manifold element 2 is made of a less robust material, such as plastic. However, the plate 10*a* is not necessarily required, and manifold element 2 may include the structure of the plate 10*a*, whether made of a plastic, metal, ceramic, composite and/or a combination of materials. Thus, the manifold element 2 in another embodiment may be joined to the support 10 in a way similar to the FIG. 2 embodiment, e.g., using a sealing element 31 between a peripheral flange of the manifold element 2 and the support 10 around the periphery of the cavity 11, if needed. Also, the components 3 may be secured directly to the manifold element 2, rather than a plate 10*a*.

Figure 4:
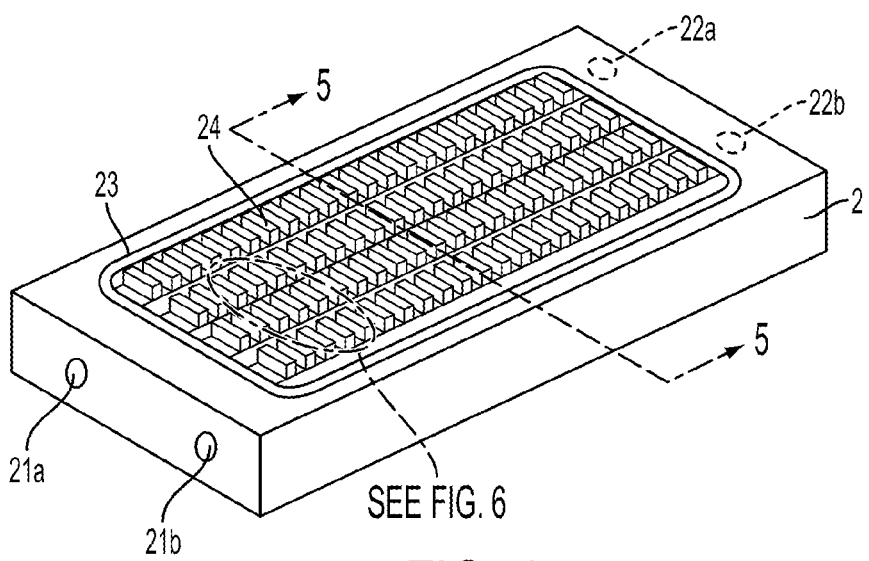
FIG. 4 shows a perspective view of a manifold element in an illustrative embodiment.

FIG. 4 shows a perspective view of a manifold element 2 in an illustrative embodiment. In this embodiment, the element 2 includes one or more inlet ports 21*a*, 21*b* and one or more outlet ports 22*a*, 22*b* that may communicate with respective fluid ports or plenums in the cavity 11. As noted above, these ports 21, 22 may include a seal element, such as an o-ring, that is used to seal a connection of the ports 21, 22 to a corresponding flow path 14 port in the cavity 11. Also, the inlet and outlet ports 21 and 22 are at opposite ends of the manifold element 2 in this embodiment, e.g., such that cooling fluid flows into the element 2 at one end and exits at the other end. Of course, the inlet and outlet ports 21, 22 may be arranged in other ways, e.g., there may be only one inlet port 21 and one outlet port 22 and the ports 21, 22 may be arranged on a same end of the element 2 or even on adjacent faces of element 2. The manifold elements may be sized so that when received in the cavity 11 and a heat generating component 3 is placed over the element 2, the component 3 may squeeze down on the element 2 to help ensure proper contact with the element 2 and that a thickness of the flow paths between the element 2 and the component 3 is properly defined.

Figure 5:
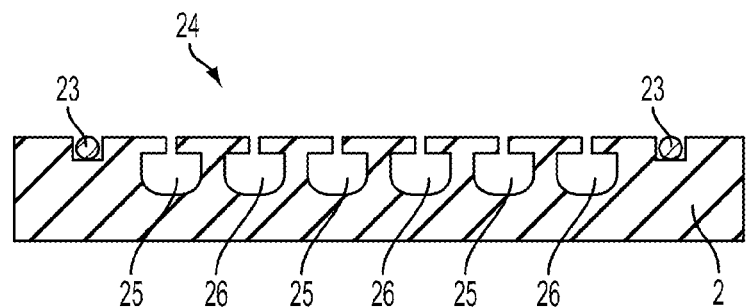
FIG. 5 shows a cross sectional view along the line 5-5 in FIG. 4.

FIG. 5 shows a cross sectional view of the manifold element 2, illustrating that the element 2 includes a plurality of inlet channels 25 and a plurality of outlet channels 26 that are open to upper surface of the element at the cooling area 24. As a result, cooling fluid provided into the inlet ports 21 may flow in the inlet channels 25 and upwardly to the upper surface of the manifold element 2. Fluid at the upper surface may contact the heat transfer surface of the heat generating component 3 to remove heat and then flow downwardly into an adjacent outlet channel 26. Since the inlet and outlet channels 25, 26 are interdigitated, the cooling liquid may flow a relatively short distance from an inlet channel 25 to an outlet channel 26, receiving heat from the heat transfer surface and exiting the manifold element 2.

Figure 6:
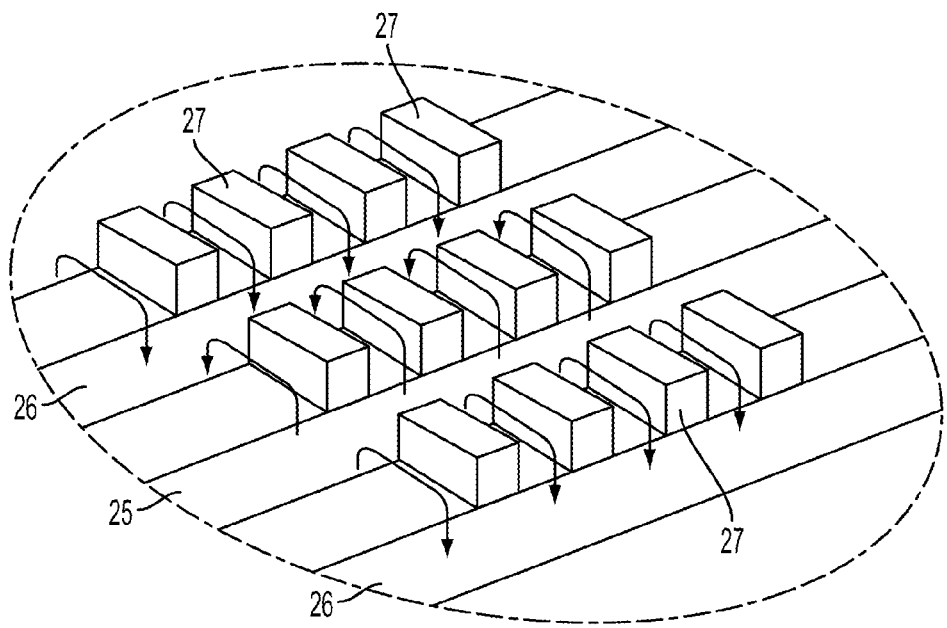
FIG. 6 shows a close up perspective view of the portion of the manifold element identified by reference number 6 in FIG. 6.

FIG. 6 shows a close up view of a portion of the manifold element of FIG. 4 at the area designated by reference number 6. The upper surface of the manifold element 2 includes a plurality of protrusions 27 that extend upwardly between the inlet and outlet channels 25, 26. The protrusions 27, which are formed as ribs in this embodiment, are arranged to contact the heat transfer surface of the component 3 so as to define the thickness of a gap between the upper surface of the manifold element 2 and the heat transfer surface. As can be seen in FIG. 6, cooling liquid flows up from inlet channels 25, outwardly in the gap between the element 2 and the heat transfer surface then downwardly into an adjacent outlet channel 26. The distance between adjacent protrusions 27, the thickness of the gap and the distance the fluid travels between channels 25 and 26, at least in part, defines a flow restriction of the manifold element 2, and can define a flow rate of cooling fluid through the manifold element 2 as well as a heat transfer rate to the cooling fluid. For example, for a given distance between protrusions 27 (e.g., 3-20 mm) and distance between inlet and outlet channels 25, 26 (e.g., between 5-25 mm such as 10 mm), different gap thicknesses (e.g., between 0.05 mm-2 mm such as 0.15 mm) in the flow paths defined by the protrusions 27 may provide different fluid dynamic features for the flow of the cooling fluid. At a higher flow rate, a thicker gap thickness may induce more turbulence in the cooling fluid flow, enhancing both shear stress and heat transfer, while at a lower flow rate a thinner gap thickness may allow for greater shear stress and heat transfer rate in a laminar flow. Accordingly, as will be understood by those of skill in the art, the protrusions 27 may be arranged to provide a resistance to flow (e.g., defined in part by the gap thickness) that matches a heat removal requirement for the heat generating component 3 for a given cooling fluid flow rate and temperature. For example, if a heat generating device requires a relatively high flow rate for cooling purposes, the protrusions 27 may be arranged to provide a relatively larger gap for increased flow rate and high turbulence. Alternately, the protrusions 27 may be made shorter to provide a smaller gap for a component 3 that requires efficient cooling with a smaller flow rate. In addition, the cooling area 24 of the element 2 may be sized as needed to provide a desired heat removal rate from the component 3.

Figure 7:
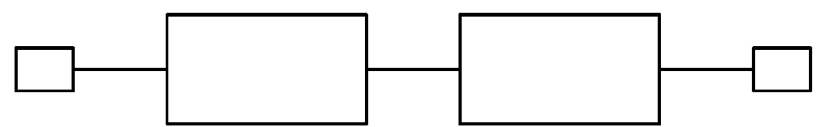
FIG. 7 shows an arrangement for routing cooling fluid in an illustrative embodiment having manifold devices in series.
Figure 8:
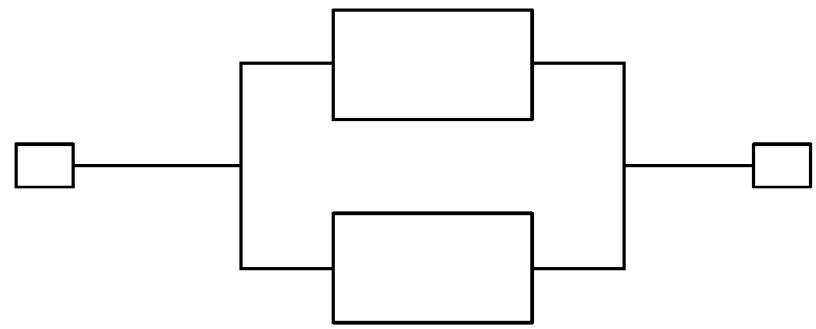
FIG. 8 shows an arrangement for routing cooling fluid in another illustrative embodiment having manifold devices in parallel.

As noted above, the manifold devices 2 may be arranged in the flow path 14 of the support 10 in a variety of different ways, such as in series as shown schematically in FIG. 7 or in parallel as shown in FIG. 8. Also, the manifold elements may be arranged to operate in specific arrangements and depending on the cooling fluid flow configuration. For example, if two heat generating components 3 have a same heat removal requirement and are placed in series in a flow path 14 of a support 10, there likely will be some difference between the manifold elements 2 used with each component 3. For example, the manifold elements 2 may have a same resistance to flow, but the upstream element 2 may have a smaller cooling area 24 than the downstream element 2 so that the heat removal requirements of the two components 3 will be met. For example, since some heat will be removed from the upstream component 3, a temperature difference between the downstream component's heat transfer surface and the cooling fluid may be lower than that for the upstream component. To compensate, the cooling area 24 of the downstream element 2 may be made larger so that a suitable amount of heat may be removed from the component 3. Alternatively the height of protrusions 27 and the distance between inlet and outlet channels 25 and 26 may be altered to achieve the desired adjustment in cooling performance.

In contrast, if the two heat generating components 3 are arranged in parallel in the flow path 14 of the support 10, the manifold elements 2 may be arranged in a same way, having a same restriction to flow since the components 3 in this example have a same heat removal requirement. Of course, if the components 3 had different heat requirements, the manifold elements 2 may be arranged in different ways. For example, if two components are arranged in parallel in the flow path 14, a component 3 having a higher heat removal requirement may be coupled to a manifold element 2 having a lower resistance to flow (and possibly a larger cooling area 24) than the other component 3. Altering the flow resistance of a manifold element 2 may be accomplished by adjusting the height of protrusions 27 on the upper surface of the manifold element 2, which may also have an effect on the fluid dynamics of the cooling fluid in its flow near the heat transfer surface of the component 3. For example, a suitably thin flow path extending between inlet and outlet channels 25, 26 of a manifold element 2 may induce higher laminar shear in the fluid, helping to enhance heat transfer. In contrast, a thicker flow path defined by protrusions 27 may allow for more turbulence at the heat transfer surface, potentially enhancing heat transfer by means of greater turbulent shear. Accordingly, adjusting a flow resistance of a manifold element 2 may not only effect a flow rate of cooling fluid through the manifold element 2, but also the cooling fluid's ability to receive heat from the component 3.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. An assembly for cooling two or more heat generating components, comprising:
   a support having an inlet for receiving cooling fluid and an outlet for expelling the cooling fluid, the support including first and second cavities formed in an upper surface, each cavity in fluid communication with the inlet and the outlet;
   first and second heat generating components each having a bottom heat transfer surface, the first and second heat generating components arranged to be positioned over the first and second cavities, respectively, and respectively having first and second heat removal requirements; and
   first and second manifold elements each having a plurality of interdigitated inlet and outlet channels that are open at an upper surface of the manifold element, the first manifold element arranged to be received in the first cavity with portions of the upper surface in contact with the heat transfer surface of the first heat generating device such that cooling fluid can flow from the inlet channels upwardly into a space between the upper surface of the manifold element and downwardly into an outlet channel, the second manifold element arranged to be received in the second cavity with portions of the upper surface in contact with the heat transfer surface of the second heat generating device such that cooling fluid can flow from the inlet channels upwardly into a space between the upper surface of the manifold element and downwardly into an outlet channel;
   wherein the inlet and outlet channels and the upper surface of the first and second manifold elements are arranged to provide first and second restrictions to flow, respectively, through the manifold element that are matched to the individual heat removal requirements of the respective heat generating components.

2. The assembly of claim 1, wherein the first and second restrictions are arranged such that the first and second heat removal requirements of the first and second heat generating components are met for a single cooling fluid flow rate provided at the inlet of the support.

3. The assembly of claim 2, wherein the support includes a single inlet.

4. The assembly of claim 1, wherein the support has a single inlet and a single outlet.

5. The assembly of claim 4, wherein the first and second heat removal requirements are different from each other.

6. The assembly of claim 1, wherein the manifold elements each include protrusions on the upper surface that contact the heat transfer surface and define a plurality of fluid channels between pairs of inlet channels and outlet channels.

7. The assembly of claim 1, wherein the protrusions have a height that is matched to the heat removal requirement of the respective heat generating device.

8. The assembly of claim 1, wherein the first and second flow restrictions are different from each other.

9. The assembly of claim 1, wherein the support has a single inlet and a single outlet and a flow path from the single inlet to the single outlet, and wherein the first and second cavities are arranged in series such that the first cavity is upstream of the second cavity.

10. The assembly of claim 1, wherein the support has a single inlet and a single outlet and a flow path from the single inlet to the single outlet, and wherein the first and second cavities are arranged in parallel.

11. The assembly of claim 1, wherein the manifold elements include a sealing feature on the upper surface that circumscribes an area of the upper surface and a cooling area inside the area circumscribed by the sealing feature.

12. The assembly of claim 11, wherein the cooling area of the first manifold element is smaller than the cooling area of the second manifold element.

13. The assembly of claim 1, wherein the manifold elements are formed of a plastic.

14. An assembly for cooling two or more heat generating components, comprising:
a support having an inlet for receiving cooling fluid and an outlet for expelling the cooling fluid, the support including a cavity formed in an upper surface, the cavity being in fluid communication with the inlet and the outlet;
first and second heat generating components each having a bottom heat transfer surface, the first and second heat generating components arranged to be positioned over the cavity and respectively having first and second heat removal requirements; and
a manifold element received in the cavity and having first and second cooling areas each including a plurality of interdigitated inlet and outlet channels that are open at an upper surface of the manifold element, the first cooling area having portions of the upper surface in contact with the heat transfer surface of the first heat generating device such that cooling fluid can flow from the inlet channels upwardly into a space between the upper surface of the manifold element and the heat transfer surface, and downwardly into an outlet channel, the second cooling area having portions of the upper surface in contact with the heat transfer surface of the second heat generating device such that cooling fluid can flow from the inlet channels upwardly into a space between the upper surface of the manifold element and the heat transfer surface, and downwardly into an outlet channel;
wherein the inlet and outlet channels and the upper surface of the first and second cooling areas are arranged to provide first and second restrictions to flow, respectively, through the manifold element that are matched to the individual heat removal requirements of the respective heat generating components.

15. The assembly of claim 14, wherein the support further comprises a plate having first and second apertures, wherein the plate is positioned over the cavity such that the first and second cooling areas extend upwardly through the first and second apertures, respectively.

16. The assembly of claim 15, wherein the first and second heat generating components are secured to the plate.

17. The assembly of claim 16, wherein a sealing feature is provided between the plate and the first and second heat generating components, respectively, and the sealing feature circumscribes a corresponding cooling area of the manifold element.

18. The assembly of claim 14, wherein the first and second heat generating components are secured to the manifold element.

19. The assembly of claim 18, wherein a sealing feature is provided between the manifold element and the first and second heat generating components, respectively, and the sealing feature circumscribes a corresponding cooling area of the manifold element.

20. The assembly of claim 14, wherein the first and second flow restrictions are different from each other.

* * * * *